United States Patent [19]

Kizaki et al.

[11] Patent Number: 5,763,892
[45] Date of Patent: Jun. 9, 1998

[54] ULTRAVIOLET IRRADIATOR FOR SUBSTRATE, SUBSTRATE TREATMENT SYSTEM, AND METHOD OF IRRADIATING SUBSTRATE WITH ULTRAVIOLET LIGHT

[75] Inventors: Koji Kizaki; Masahiro Miyagi; Katsunaga Narita, all of Shiga, Japan

[73] Assignee: Dainippon Screen Manufacturing Company, Ltd., Japan

[21] Appl. No.: 665,474

[22] Filed: Jun. 18, 1996

[30] Foreign Application Priority Data

Jun. 19, 1995 [JP] Japan ................... 7-151978
Nov. 17, 1995 [JP] Japan ................... 7-300186
May 13, 1996 [JP] Japan ................... 8-117864

[51] Int. Cl.⁶ ........................................ G03B 27/52
[52] U.S. Cl. ........................ 250/492.1; 250/492.2; 250/493.1
[58] Field of Search ............... 250/492.1, 492.2, 250/492.3, 493.1

[56] References Cited

U.S. PATENT DOCUMENTS

| | | | |
|---|---|---|---|
| 5,097,136 | 3/1992 | Meyer et al. | 250/492.1 |
| 5,136,170 | 8/1992 | Gellert | 250/492.1 |
| 5,171,965 | 12/1992 | Suzuki et al. | 250/492.1 |
| 5,221,423 | 6/1993 | Sugino et al. | 156/643 |
| 5,510,158 | 4/1996 | Hiramoto et al. | 427/582 |
| 5,542,441 | 8/1996 | Mohindra et al. | 134/95.2 |
| 5,616,443 | 4/1997 | Nohr et al. | 430/106 |
| 5,627,627 | 5/1997 | Suzuki | 355/68 |

*Primary Examiner*—Bruce Anderson
*Attorney, Agent, or Firm*—Ostrolenk, Faber, Gerb & Soffen, LLP

[57] ABSTRACT

A dielectric barrier discharge excimer lamp is employed as a lamp for emitting ultraviolet light, and this dielectric barrier discharge excimer lamp is turned on during a time period, which is shorter than a working period, for supplying a prescribed amount of ultraviolet energy to a substrate. Even if the working period changes, therefore, the dielectric barrier discharge excimer lamp is turned off when the ultraviolet energy to the substrate reaches the prescribed amount, so that the ultraviolet energy is maintained at a constant level and no excessive temperature rise takes place in the interior of an irradiator. Due to the employment of the dielectric barrier discharge excimer lamp, it is possible to stabilize lamp output within a short time after the lamp is turned on even if the lamp is repeatedly turned on and off, whereby the ovearll time for overall treatment steps is reduced.

19 Claims, 18 Drawing Sheets

FIG. 3

| RECIPE NO. | SPIN PART | UV | HP | CP | ... |
|---|---|---|---|---|---|
| 1 | 10 | 5 | 2 | 7 | ... |
| ⋮ | ⋮ | ⋮ | ⋮ | ⋮ | ... |
| 100 | 9 | 1 | 8 | 4 | ... |
| ⋮ | ⋮ | ⋮ | ⋮ | ⋮ | ... |
| 255 | ⋮ | 2 | ⋮ | ⋮ | ... |

FIG. 4

| RECIPE NO. | PROCESS DATA NO. |
|---|---|
| 1 | 5 |
| ⋮ | ⋮ |
| 100 | 1 |
| ⋮ | ⋮ |
| 255 | 2 |

| PROCESS DATA NO. | IRRADIATION TIME (SEC.) |
|---|---|
| 1 | 40 |
| 2 | 50 |
| ⋮ | ⋮ |
| ⋮ | ⋮ |
| 5 | 80 |
| ⋮ | ⋮ |

FIG. 10

| PROCESS DATA NO. | IRRADIATION TIME FOR UPPER SURFACE (SEC.) | IRRADIATION TIME FOR LOWER SURFACE (SEC.) |
|---|---|---|
| 0 | 0 | 0 |
| 1 | 10 | 0 |
| 2 | 20 | 0 |
| ⋮ | ⋮ | ⋮ |
| 10 | 0 | 10 |
| 11 | 10 | 10 |
| ⋮ | ⋮ | ⋮ |
| 20 | 0 | 20 |
| 21 | 10 | 20 |
| ⋮ | ⋮ | ⋮ |

ULTRAVIOLET IRRADIATOR FOR SUBSTRATE, SUBSTRATE TREATMENT SYSTEM, AND METHOD OF IRRADIATING SUBSTRATE WITH ULTRAVIOLET LIGHT

BACKGROUND OF THE INVENTION

1. Field of the Invention

The present invention relates to an ultraviolet irradiator which is employed for a substrate treatment, a substrate treatment system including the ultraviolet irradiator, and a method of irradiating a substrate with ultraviolet light.

2. Description of the Background Art

As is well known in the art, various treatments are performed on a precision electronic substrate (hereinafter simply referred to as "substrate") such as a glass substrate or a semiconductor wafer, in a fabrication process for a flat panel display such as a liquid crystal display, a plasma display or an EL display or a semiconductor device. Employed for this purpose are a dry treatment unit such as an ultraviolet irradiator for irradiating the substrate with ultraviolet light by a low-pressure mercury lamp for decomposing organic substances adhering to the surface of the substrate, a wet treatment unit such as a spin scrubber for thereafter rotating the substrate and supplying a cleaning solution to its surface for cleaning the substrate surface, and the like.

Among these units, the ultraviolet irradiator irradiates the substrate with ultraviolet light for breaking bonds between atoms which compose organic substances on the substrate surface and also for generating ozone near the surface. This ozone decomposes and removes organic substances whose bonds are broken to convert the substrate surface to a hydrophilic state for improving a cleaning effect in a later cleaning step.

On the other hand, a plurality of the aforementioned treatment units may be combined with each other to form a substrate treatment system continuously performing a series of treatments. In this case, the substrate treatment system is constructed to drive the plurality of treatment units simultaneously so that a carrier robot for carrying the substrates in the system moves between the respective treatment units successfully and circulatively for bringing a substrate W1 removed from a certain treatment unit U1 to another treatment unit U2, taking out a treated substrate W2 from the treatment unit U2 and introducing the supplied substrate W1 into this treatment unit U2, and carrying the substrate W2 to still another treatment unit U3 while performing a series of treatments on the respective substrates by successively carrying the same.

The dry treatment unit treats a substrate surface without supplying a treatment solution, and corresponds to a hot plate, a cool plate or the like, in addition to the aforementioned ultraviolet irradiator. On the other hand, the wet treatment unit treats a substrate surface with a prescribed treatment solution, and corresponds to an apparatus for various kinds of cleaning such as ultrasonic cleaning, brush cleaning, pure water cleaning, a spin coater, a spin developer, an etching unit or a separator, in addition to the aforementioned spin scrubber.

In case of performing ultraviolet irradiation on a substrate by the aforementioned ultraviolet irradiator, the dose of radiation given is a function of the illuminance of a light source, the distance between the light source and the substrate, the irradiation time and the like, each of which is listed as a parameter of a treatment condition that will achieve a particular treatment result. The dose is decided by the irradiation time when the illuminance and the distance are constant. A proper dose (proper irradiation time when the illuminance and the distance are constant) which is a treatment condition for obtaining an optimum treatment result, is varied generally with the type of a thin film that is formed on a surface of the substrate.

In the aforementioned substrate treatment system, on the other hand, the time for treating a single substrate as a whole, i.e., the time for a carrier robot for coming full circle to the original position through the respective treatment units, i.e., the cycle period, becomes the longest working period among those of the treatment units if no time required for the carrier robot for carrying the substrate is taken into consideration, and the treatment unit having this working period determines the substrate treatment system. Assuming that a proper irradiation time in the ultraviolet irradiator is 50 seconds while 100 seconds are required for the treatment in a hot plate requiring the longest time, for example, the cycle period becomes the longest time, i.e., 100 seconds. In this case, the carrier robot requires 100 seconds for introducing a certain substrate W2 into the ultraviolet irradiator, bringing a next substrate W1, discharging the treated substrate W2 and returning to the ultraviolet irradiator for introducing the substrate W1. Thus, the substrate cannot be immediately discharged by the carrier robot after a lapse of the proper irradiation time of 50 seconds in the ultraviolet irradiator, and hence the same remains in the ultraviolet irradiator in a standby state up to a lapse of the cycle period.

In the conventional ultraviolet irradiator, the low-pressure mercury lamp which is the light source for the ultraviolet light is regularly turned on. As shown in FIG. 22, the low-pressure mercury lamp requires a long time ($\Delta t$) for stabilizing its output after the same is temporarily turned off and again turned on at a time $T_3$, and hence the cycle period is lengthened. This is because discharge gas is a mercury vapor and hence a long time is required for warming up the lamp, evaporating mercury in a lamp tube for attaining a certain constant vapor pressure and stabilizing the output in a stationary state when the lamp is temporarily turned off and then turned on again. However, in the treatment step of ultraviolet irradiation, the proper dose of the ultraviolet light for obtaining the optimum treatment result is varied in accordance with whether or not a thin film is formed on the material for or the surface of the treated substrate, and/or various conditions such as the film type, the film thickness etc. if the thin film is formed, as described above. In case of a substrate provided with a certain thin film, for example, such inconvenience in process is caused that the substrate is whitened or the characteristics of a transistor to be formed on the substrate are changed upon irradiation with ultraviolet light exceeding a prescribed dose due to an excessive irradiation time or the like, leading to a defective product.

In the substrate treatment system which is formed by combining a plurality of treatment units as described above, the cycle period is generally decided by conditions other than those of the ultraviolet irradiator. When the general ultraviolet irradiator is regularly and continuously turned on the light source for the ultraviolet light is applied to the aforementioned substrate treatment system, therefore, the optimum irradiation treatment result is rarely obtained. That is, such optimum result is obtained only when the cycle period of the substrate treatment system is coincident with the proper irradiation time forming the optimum condition for the treated substrate. If the proper irradiation time for the optimum condition in the ultraviolet irradiator is 50 seconds and the cycle period is 100 seconds as described above, the carrier robot for carrying the substrate does not circulate to the ultraviolet irradiator until the cycle period lapses, and hence the substrate must be brought into a standby state in the ultraviolet irradiator up to the lapse of the cycle period while being continuously irradiated with the ultraviolet light, leading to inconvenience in the process.

Assuming that $T_W$ represents the cycle period, $T_R$ presents a time for introducing/discharging the substrate into/from the ultraviolet irradiator, and $T_T$ represents the proper irradiation time as shown in FIG. 23, for example, the substrate is irradiated with the ultraviolet light during the time $T_R$ as well as after a lapse of the proper irradiation time $T_T$. Thus, the substrate is disadvantageously irradiated with the ultraviolet light for excess times $T_{O1}$ and $T_{O2}$ over the proper irradiation time $T_T$, leading to inconvenience in process. While the cycle period has been explained with reference to a substrate treatment system provided with a carrier robot circulating along the respective treatment units in the above, the cycle period can similarly be considered also as to the so-called in-line substrate treatment system in which carriers are arranged for a plurality of treatment units exclusively between these units.

When a low-pressure mercury lamp is employed, the lamp output is reduced due to time change resulting from long-time use. Consequently, ultraviolet energy which is supplied to the substrate is reduced although the lamp is continuously turned on, leading to such a problem that desired treatment is not performed due to insufficient exposure.

When the low-pressure mercury lamp is regularly turned on, the temperature in the interior of the irradiator is increased due to a heat ray which is emitted simultaneously with the ultraviolet light, to disadvantageously warp a glass substrate for a liquid crystal display or the like. Consequently, mechanical troubles such as a carriage trouble, imperfect registration, imperfect chucking and the like are caused, to lead to such a significant trouble that imperfect chucking is caused by mechanical chucking when the substrate is carried to a spin type cleaning unit (spin scrubber) to break the substrate to pieces when the same is rotated in the imperfectly chucked state. In order to attain weight reduction, size increase and cost reduction recently required for a liquid display, in particular, thickness reduction of the glass substrate, size increase, or conversion to a material having a high thermal expansion coefficient such as low-priced alkali glass or low alkali glass is necessary, and the problem of warping of the substrate becomes more and more significant.

SUMMARY OF THE INVENTION

The present invention is directed to an ultraviolet irradiator for irradiating a substrate with ultraviolet light.

According to the present invention, this irradiator comprises a light source for irradiating the substrate with ultraviolet light, and control means for controlling this light source. The control means is provided with storage means for storing a plurality of values expressing different doses of the ultraviolet light for the substrate, selection means for selecting a single value from the plurality of values, and irradiation control means for changing the irradiation of the substrate with the ultraviolet light by the light source in response to the single value.

In an aspect of the present invention, the selection means is provided with designation means for designating a single type among a plurality of types of treatments for the substrate, and means for selecting the single value in response to the single type.

The irradiator according to the present invention is used for cleaning a surface of the substrate, for example.

Preferably, the light source is a dielectric barrier discharge excimer lamp.

The present invention also provides a substrate treatment system using such an ultraviolet irradiator.

In a typical exemplary application of the present invention, the substrate is a glass substrate.

Accordingly, an object of the present invention is to properly irradiate a substrate with ultraviolet light in correspondence to various substrate treatments.

Another object of the present invention is to perform ultraviolet irradiation with no influence exerted by change of a working period.

Still another object of the present invention is to perform ultraviolet irradiation with no influence exerted by time change of a lamp.

A further object of the present invention is to prevent a glass substrate from warping caused by temperature rise in the interior of an irradiator.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a table for an exemplary first procedure controlled by a master CPU;

FIG. 4 is a table for an exemplary second procedure controlled by an ultraviolet irradiator CPU;

FIG. 10 is a table for an exemplary fourth procedure controlled by an ultraviolet irradiator CPU;

DESCRIPTION OF THE PREFERRED EMBODIMENTS

<Overall Structure and Control>

Figure 1:
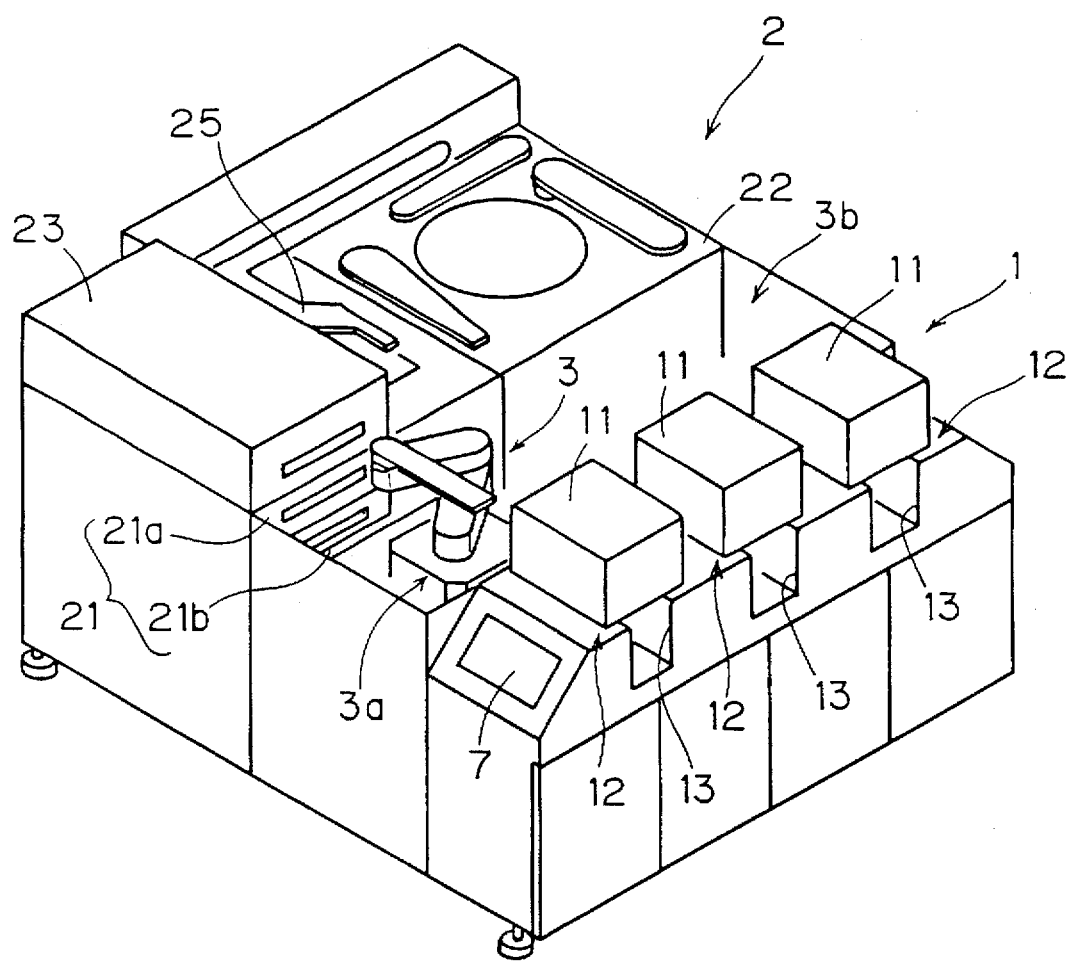
FIG. 1 is a perspective showing a substrate treatment system according to a preferred embodiment of the present invention.
Figure 2:
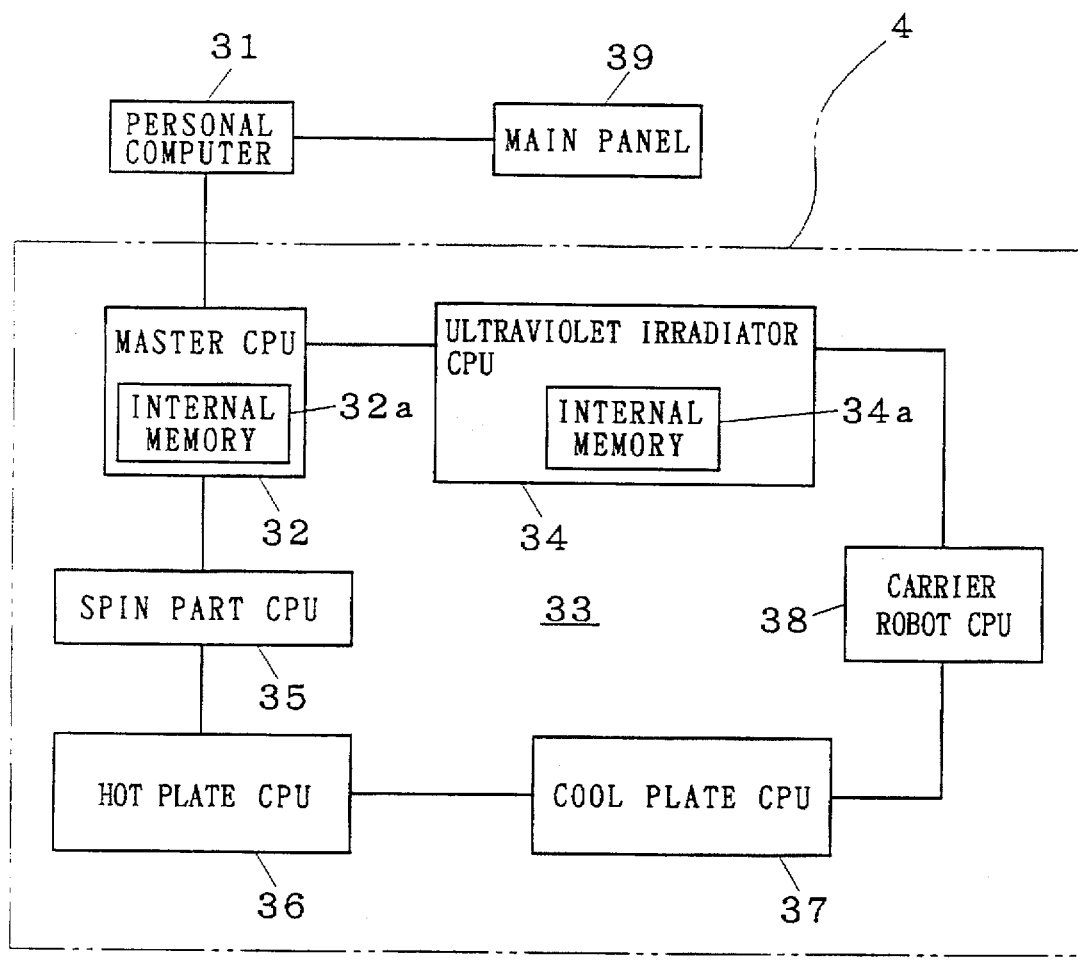
FIG. 2 is a control block diagram of the substrate treatment system according to the embodiment.

FIG. 1 is a perspective view showing a substrate treatment system according to a preferred embodiment of the present invention. This substrate treatment system is formed by an indexer part 1, a surface treatment part 2, a carrier part 3, and a control part 4 (FIG. 2), as a system for cleaning a glass substrate for a liquid crystal display.

As shown in FIG. 1, the indexer part 1 serves as a substrate supply and discharge part. Three cassettes 11, each capable of storing a plurality of substrates, are placed on a cassette receiving part 12, so that the carrier part 3 can take out and store substrates from and in the cassettes 11. The cassettes 11 are transferred to and from the indexer part 1 by an AGV (automatic guided vehicle: automatic carrier robot) (not shown) through depressed parts 13.

In the surface treatment part 2, a heat treatment part 21 consisting of a hot plate 21a and a cool plate 21b for heating and cooling the substrates respectively and a spin scrubber (hereinafter referred to as "spin part") 22 for supplying a cleaning solution and cleaning the substrates while rotating the same are oppositely arranged substantially in parallel with the direction of arrangement of the cassettes 11, while being separated from the indexer part 1 by a constant distance. On the other hand, an ultraviolet irradiator 23 is arranged on the heat treatment part 21 for irradiating surfaces of the substrates with ultraviolet light in an oxygen atmosphere and generating ozone, thereby performing a cleaning treatment of separating organic substances on the substrate surfaces into water and carbonic acid gas, i.e., dry cleaning. Thus, the surface treatment part 2 is provided with a plurality of surface treatment units (the hot plate 21a, cool plate 21b, the spin part 22 and the ultraviolet irradiator 23 are hereinafter generically called by this term), for carrying the substrates between these surface treatment units in proper order by a carrier robot 3a described later, thereby cleaning the substrates through the surface treatment units.

The carrier part 3 includes carrier robot 3a that is disposed in a carrier passage 3b between the indexer part 1 and the surface treatment part 2, and is mounted to move along a guide rail (not shown) which is fixed to a bottom portion of the carrier passage 3b by a robot driving mechanism (not shown). Robot 3a circulating between the surface treatment units in part 2 and the indexer part 1, and carries the substrates successively.

The control part 4, which is adapted to mainly control operation of the surface treatment part 2 and the carrier part 3 through a predetermined procedure called a recipe, comprises a master CPU 32 which is connected with a personal computer system (hereinafter simply referred to as "PC system") 31 for an operator for inputting/outputting data, and a plurality of local CPUs such as an ultraviolet irradiator CPU 34, a spin part CPU 35, a hot plate CPU 36 and a cool plate CPU 37. These local CPUs 34 to 37 are adapted to control operations of corresponding ones of the surface treatment units, and connected with the master CPU 32 through a local area network (hereinafter simply referred to as "LAN") 33. The PC system 31 is connected with a main panel 39 serving as an input/output unit, displaying various data, for the operator for inputting various data.

The master CPU 32 comprises an internal memory 32a, which stores a first procedure table indicating the contents of a plurality of procedures. FIG. 3 shows the first procedure table. Referring to this first procedure table, procedure numbers (hereinafter referred to as "recipe Nos.") are allocated to the respective procedures, while data (hereinafter referred to as "process data Nos." indicating the contents of treatments to be executed in the respective surface treatment units are stored as to the respective procedures. According to this embodiment, the respective procedures of the first procedure table, which indicate the contents of proper treatments for the types of thin films formed on the surfaces of the treated substrates, are previously decided, inputted and stored experimentally or on the basis of rule of thumb.

Figures 5, 6:
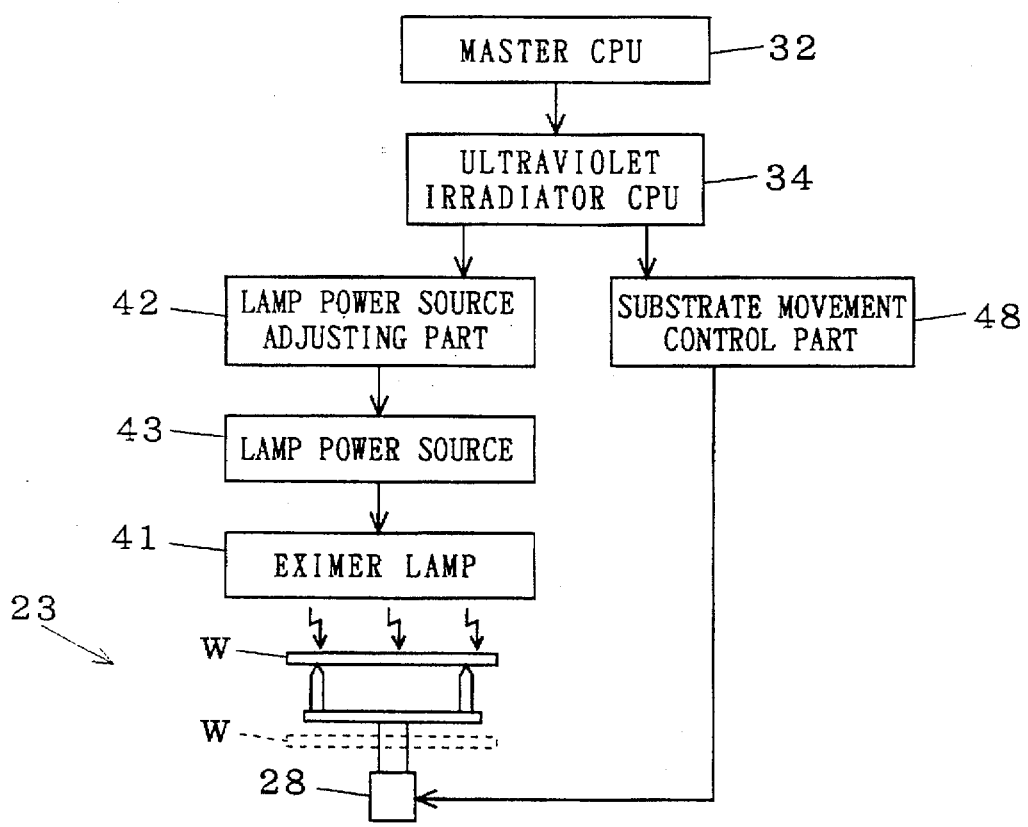
FIG. 5 is a table for an exemplary third procedure controlled by the ultraviolet irradiator CPU.
FIG. 6 is a control block diagram for operation of an ultraviolet irradiator according to the preferred embodiment of the present invention.

Each local CPU comprises an internal memory, which stores second and third procedure tables expressing the contents of treatments to be executed in the surface treatment unit corresponding to the local CPU. FIGS. 4 and 5 illustrate examples of the second and third procedure tables respectively, which are stored in an internal memory 34a of the ultraviolet irradiator CPU 34 in particular. The second procedure table, which stores the content of the first procedure table stored in the internal memory 32a of the master CPU 32 divided for this local CPU and transmitted through the LAN 33, consists of recipe Nos. and process data Nos. indicating the contents of the treatment to be executed in this surface treatment unit in correspondence to the recipe Nos. On the other hand, the third procedure table, which indicates the contents of the treatment to be executed in the surface treatment unit upon designation of the process data Nos. in the second procedure table in correspondence thereto, stores proper irradiation times in the ultraviolet irradiator 23 corresponding to the respective treatment contents of the process data Nos. While the procedure table shown in FIG. 5 defines only the proper irradiation times, data related to irradiation distances may be added when the distance between the light source and each substrate can be adjusted, and data related to illuminance may be added if the illuminance of the light source can be adjusted. FIG. 5 shows only the procedure table related to the ultraviolet irradiator CPU 34. Data of proper treatment conditions such as rotational frequencies, rotation speeds and the like are stored in procedure tables related to the remaining CPUs, such as that related to the spin part CPU 35, for example, in correspondence to the respective process data Nos.

FIG. 6 is a typical control block diagram showing the structure of the ultraviolet irradiator 23. A dielectric barrier discharge excimer lamp 41 which is a lamp utilizing dielectric barrier discharge is employed as an ultraviolet irradiation light source of the ultraviolet irradiator 23. The dielectric barrier discharge excimer lamp 41 can perform a turn on/off operation in a relatively short time, whereby the dose can be correctly adjusted to a desired proper value by adjusting a turn on/off timing with respect to substrates of different film types. In more concrete terms, the dielectric barrier discharge excimer lamp 41 requires only about one second for stabilizing its turn on/off operation, although a filament lamp requires about 10 seconds for its turn on/off operation and it also requires another 10 to 15 seconds for stabilizing its operation. Even if a necessary working period is relatively short, say 5 or 6 seconds, the dose error is negligible. The ultraviolet irradiator 23 is provided therein with a substrate moving mechanism consisting of an air cylinder 28 for moving each substrate W between a substrate transfer position (shown by a broken line in FIG. 6) for the carrier robot 3a of the carrier part 3 and an ultraviolet irradiation position (shown by a solid line in FIG. 6) which is close to the dielectric barrier discharge excimer lamp 41 and suitable for ultraviolet irradiation and a substrate movement control part 48 for controlling the air cylinder 28. The ultraviolet irradiator CPU 34 is so formed as to drive the substrate moving mechanism 28 through the substrate movement control part 48 for moving each substrate W to the position suitable for ultraviolet irradiation, while switching a lamp power source 43 on and off through a lamp power source adjusting part 42 at a timing which is responsive to the obtained necessary working period for controlling the turn on/off operation of the dielectric barrier discharge excimer lamp 41. Details of control timing are described hereinafter.

The operations of the substrate treatment system having the aforementioned structure will now be described. According to one embodiment of the instant invention, the substrates are subjected to dry cleaning by ultraviolet irradiation, wet cleaning, heating and cooling in that order. The respective treatments are performed by the ultraviolet irradiator 23, the spin part 22, the hot plate 21a and the cool plate 21b, and hence the substrates which are taken out from the cassettes 11 of the indexer part 1 are successively carried between the respective surface treatment units by the carrier robot 3a in that order. The respective surface treatment units simultaneously perform the treatments of the substrates, whereby the plurality of substrates are simultaneously treated as a result. Such carrier order is previously inputted in the PC system 31 by the operator and stored in the master CPU 32, so that the carrier robot 3a is controlled by a carrier robot CPU 38 through an instruction for carriage in such order by the master CPU 32.

The operator using this substrate treatment system inputs substrate treatment conditions in the master CPU 32 through the PC system 31 by operating the main panel 39 through the recipe Nos. while taking the treatment conditions such as presence/absence of thin films on the surfaces of the substrates to be washed, types thereof etc. into consideration. Optimum treatment conditions for the substrates are designated by such input of the recipe Nos. The local CPUs corresponding to the respective surface treatment units receive such recipe Nos., so that the surface treatment units execute the treatments of the contents designated by the process data Nos. corresponding to the recipes designated by the recipe Nos.

Figure 7:
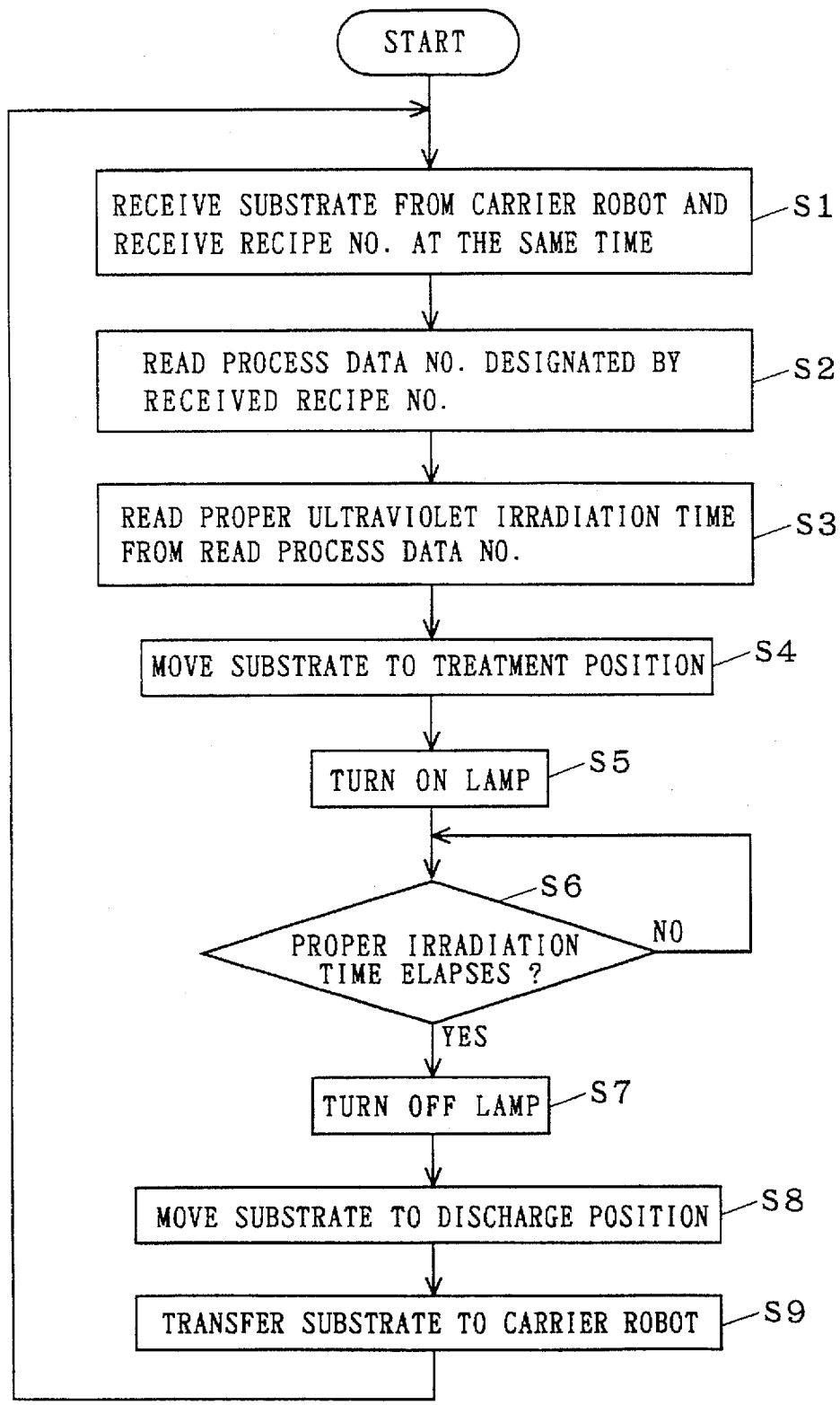
FIG. 7 is a flow chart showing operations of a substrate treatment system according to the present invention.

Treatment in the ultraviolet irradiator 23 will now be described with reference to the flow chart shown in FIG. 7. First, the carrier robot 3a receives a substrate W from the indexer part 1 and carries the substrate W to the ultraviolet irradiator 23. At the same time, the master CPU 32 transmits the recipe No. for the treatment in the first procedure table (FIG. 3) to the ultraviolet irradiator CPU 34 through the LAN 33. The ultraviolet irradiator 23 receives the substrate W from the carrier robot 3a, while the ultraviolet irradiator CPU 34 receives the recipe No. at the same time (step S1).

The ultraviolet irradiator CPU 34 refers to the received recipe No. and reads the process data No. corresponding thereto from the second procedure table (FIG. 4) (step S2). Then, the CPU 34 refers to the process data No. and reads a corresponding proper irradiation time from the third procedure table (FIG. 5) previously stored in the internal memory 34a (step S3).

Then, the CPU 34 drives the air cylinder 28 through the substrate movement control part 48, and moves the substrate W to the prescribed ultraviolet irradiation position in the ultraviolet irradiator 23 (step S4). Then, the CPU 34 turns on the dielectric barrier discharge excimer lamp 41 (step S5), and performs ultraviolet irradiation up to a lapse of the proper irradiation time read at the step S3 (step S6). Namely, the proper irradiation time is treated as a proper turn-on time of the dielectric barrier discharge excimer lamp 41 which is the light source for the ultraviolet irradiator 23 here. After a lapse of the proper irradiation time (proper turn-on time), the CPU 34 switches off the lamp power source 43 through the lamp power source adjusting part 42 for turning off the dielectric barrier discharge excimer lamp 41, thereby preventing the substrate W from being subjected to excess ultraviolet irradiation (step S7).

In this case, the dielectric barrier discharge excimer lamp 41 is employed as the light source for ultraviolet irradiation in this embodiment, whereby the lamp 41 can be stabilized in an extremely short time after being turned on as compared with the background art employing a low-pressure mercury lamp. Also when the present invention controls treatment having a necessary working period with ultraviolet light that is short as 5 to 6 seconds, the time required for stabilizing the turn on/off operation is so short that it is possible to prevent a situation where an actual exposure is significantly different from a necessary exposure. That is, the accuracy of the exposure can be improved, thereby improving the quality of the substrate treatment.

Thereafter the CPU 34 drives the substrate movement control part 48 through the substrate moving mechanism 28, moving the substrate to the substrate transfer position (step S8), and further transfers the same to the carrier robot 3a (step S9), and carries the substrate to the next step. Then, the CPU 34 returns to the step S1, for receiving the next substrate.

Figure 8:
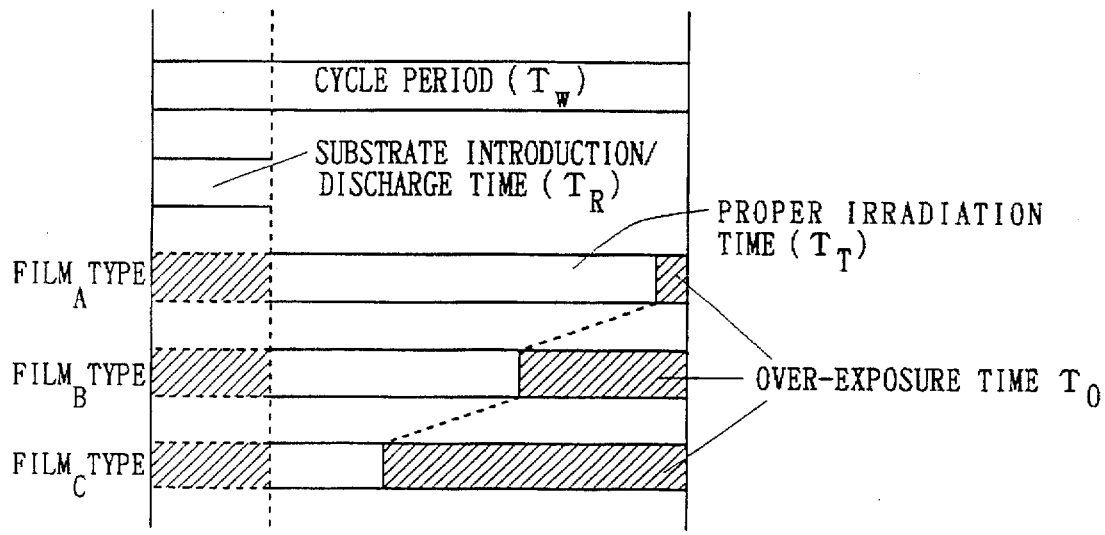
FIG. 8 is a timing chart showing the relation between proper irradiation times for a plurality of film types of substrates and cycle periods.

Thus, the dielectric barrier discharge excimer lamp 41 which can be turned on/off in a short time is used as an ultraviolet irradiation light source and the proper ultraviolet irradiation time which is responsive to the film type of the thin film on the surface of each substrate is obtained from the procedure table for carrying out ultraviolet irradiation by a proper dose, whereby substrates provided with thin films of different film types A, B and C having different proper irradiation time periods $T_T$ as shown in FIG. 8 can be irradiated with proper doses of ultraviolet light by turning on the dielectric barrier discharge excimer lamp 41 for the respective proper irradiation time periods $T_T$ while turning the dielectric barrier discharge excimer lamp 41 off during substrate introduction/discharge times $T_R$ and after lapses of the proper irradiation times $T_T$ (hatched portions in FIG. 8). Thus, it is possible to readily prevent application of excess ultraviolet irradiation as to any film types. Therefore, it is possible to prevent occurrence of imperfect processes that results in whitening of the substrates and change of characteristics of transistors to be formed, thereby improving the quality of the substrate treatment. Further, the lamp 41 may be turned on only by the necessary working period, whereby deterioration of the light source can be slowed as compared with the case of regularly turning on the light source, for increasing the life of the light source. Even if the cycle period is varied with change of the treatment conditions in the treatment units other than the ultraviolet irradiator 23, the dose of the ultraviolet light can be properly set in the ultraviolet irradiator 23 by turning on the dielectric barrier discharge excimer lamp 41 for the proper irradiation time period.

While the substrate treatment system for cleaning the substrates has been described, the present invention is not restricted to this but is also applicable to a substrate treatment system for applying resist, that performing development and the like, as a matter of course.

While FIG. 1 shows three cassettes 11, the number of the cassettes 11 is not restricted to three, while the arrangement and the shape of the carrier passage 3b and the number of the carrier robot 3a are not restricted to those shown in FIG. 1 either. For example, another surface treatment unit and another substrate treatment unit may be arranged on both ends of the carrier passage 3b, for transferring the substrates by a single or plural carrier robots.

While the dielectric barrier discharge excimer lamp 41 is employed as the light source in the above description, this takes reduction of error as to the proper irradiation time period into consideration, since some time is required for stabilizing a low-pressure mercury lamp in a turn on/off operation. However, the proper irradiation time may be sufficiently long depending on the film type, and a low-pressure mercury lamp may be employed as the light source if an error is negligible with respect to the proper irradiation time although some time is required for stabilizing the low-pressure mercury lamp in the turn on/off operation. Alternatively, the error of the exposure itself may be allowable depending on the film type. Also in this case, it is possible to employ a low-pressure mercury lamp.

While the time for turning on the light source is controlled for controlling the dose of the ultraviolet light for the substrate at a proper value, the present invention is not restricted to this but the proper dose may alternatively be obtained by providing some shutter in a state continuously turning on the light source, changing the distance between each substrate and the light source, or adjusting the illuminance of the light source.

Figure 9:
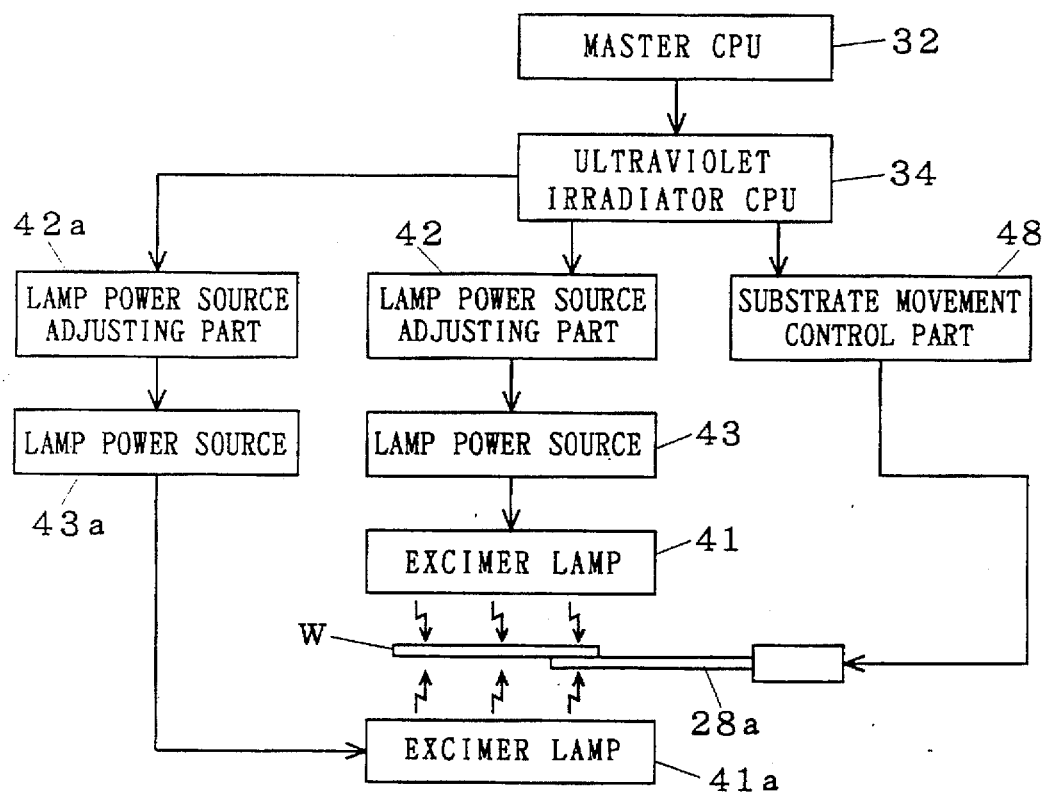
FIG. 9 is a control block diagram for operation of an ultraviolet irradiator according to another preferred embodiment of the present invention.

While the above description has been made only on the ultraviolet irradiator for irradiating only a single surface of each substrate, the irradiator may alternatively irradiate both surfaces of the substrate with ultraviolet light. While the proper dose may be varied with the states of the surface and the rear surface of the substrate, information on proper irradiation times for these surfaces may be included in the first to third procedure tables in this case. FIGS. 9 and 10 are a typical control block diagram and a diagram of a third procedure table illustrating operation an ultraviolet irradiator according to another embodiment of such a structure.

According to this embodiment, a dielectric barrier discharge excimer lamp 41a is provided under each substrate W for irradiating its lower surface with ultraviolet light, a lamp power source 43a therefor and a lamp power source adjusting part 42a are provided in addition to a dielectric barrier discharge excimer lamp 41 which is provided above the substrate W for irradiating its upper surface with ultraviolet light, a lamp power source 43 therefor and a lamp power source adjusting part 42. In this embodiment, a robot hand 28a is provided as a structure corresponding to the air cylinder 28 of the aforementioned embodiment, in order to irradiate both surfaces of the substrate W with ultraviolet light. This robot hand 28a is adapted to support only a peripheral edge portion of the substrate W, not to inhibit the substrate W from being irradiated with the ultraviolet light. The remaining structure of this embodiment is similar to that of the aforementioned embodiment. An internal memory 34a of an ultraviolet irradiator CPU 34 stores the third procedure table shown in FIG. 10. This third procedure table stores combinations of turn-on times of the dielectric barrier discharge excimer lamps 41 and 41a for the upper and lower surfaces in correspondence to process data Nos. When turn-on times for attaining proper doses for both surfaces of the substrate W are designated by the process data No. in a procedure of a recipe No. corresponding to treatment conditions for the substrate W to be irradiated with the ultraviolet light, proper doses of the ultraviolet are obtained from the third procedure table. The proper irradiation doses are responsive to the treatment conditions for the treated substrate W by the turn-on times of the dielectric barrier discharge excimer lamps 41 and 41a. In the treatment of the substrate W, it comes to that the dielectric barrier discharge excimer lamps 41 and 41a for the upper and lower surfaces are turned on by proper irradiation times for the respective surfaces. Thus, it is possible to also irradiate a substrate having long and short proper irradiation times for its front surface and rear surface, that requiring ultraviolet irradiation for only its surface and the like with ultraviolet light by proper doses through the same ultraviolet irradiator.

While the ultraviolet irradiator and the substrate treatment system according to the present invention are employed for dry cleaning in the above description, the present invention is also applicable to a treatment of hardening a photoresist film by ultraviolet irradiation, for example.

In the aforementioned embodiments, the dielectric barrier discharge excimer lamps 41 and 41a correspond to light sources; these light sources, the air cylinder 28 and the robot hand 28a correspond to illumination mechanisms; the main panel 39 corresponds to input means; the internal memories 32a and 34a correspond to storage means; and the control part 4 corresponds to control means, respectively.

<First Exemplary Ultraviolet Irradiator>

Figure 11:
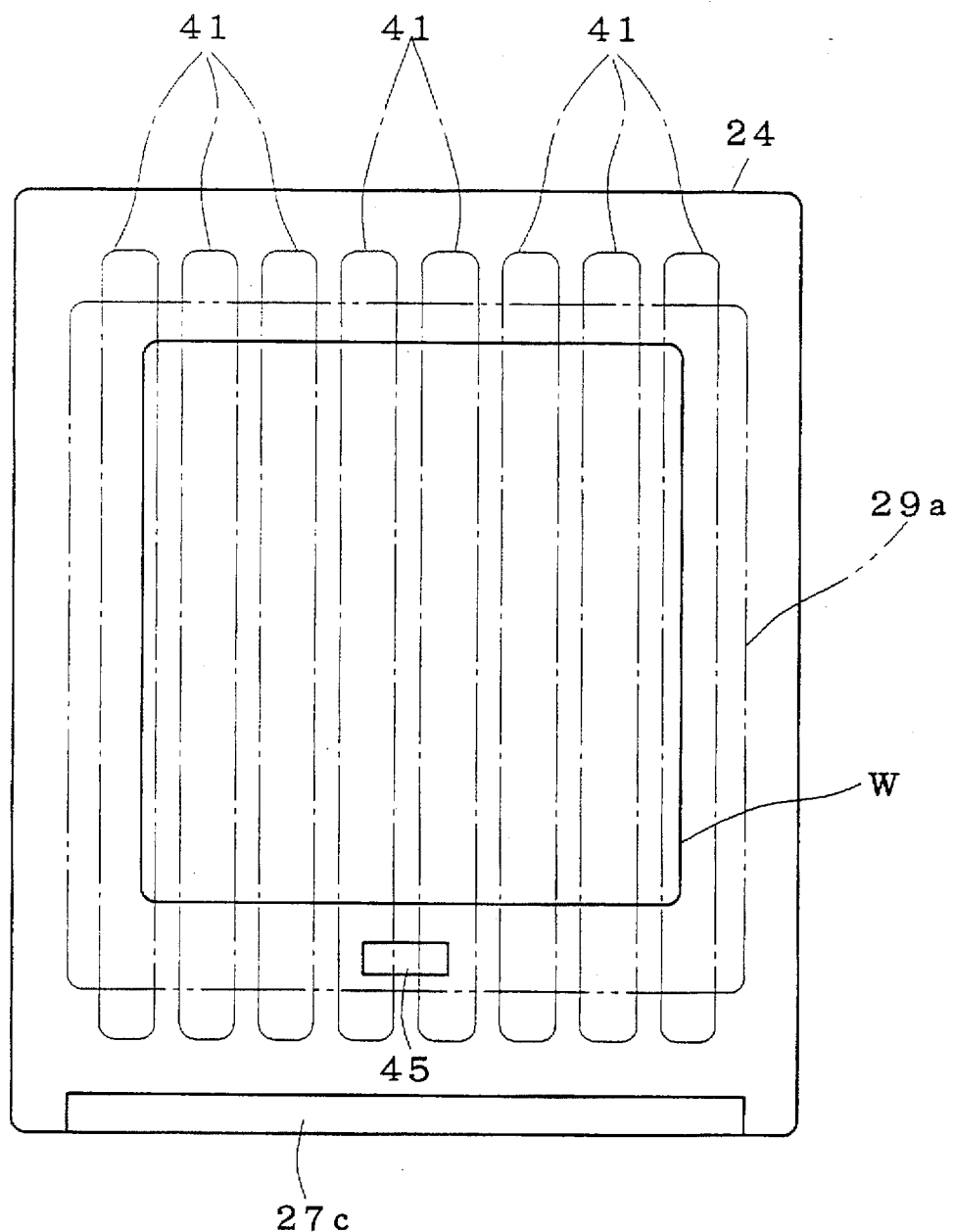
FIG. 11 is a plan view of a first exemplary ultraviolet irradiator.
Figure 12:
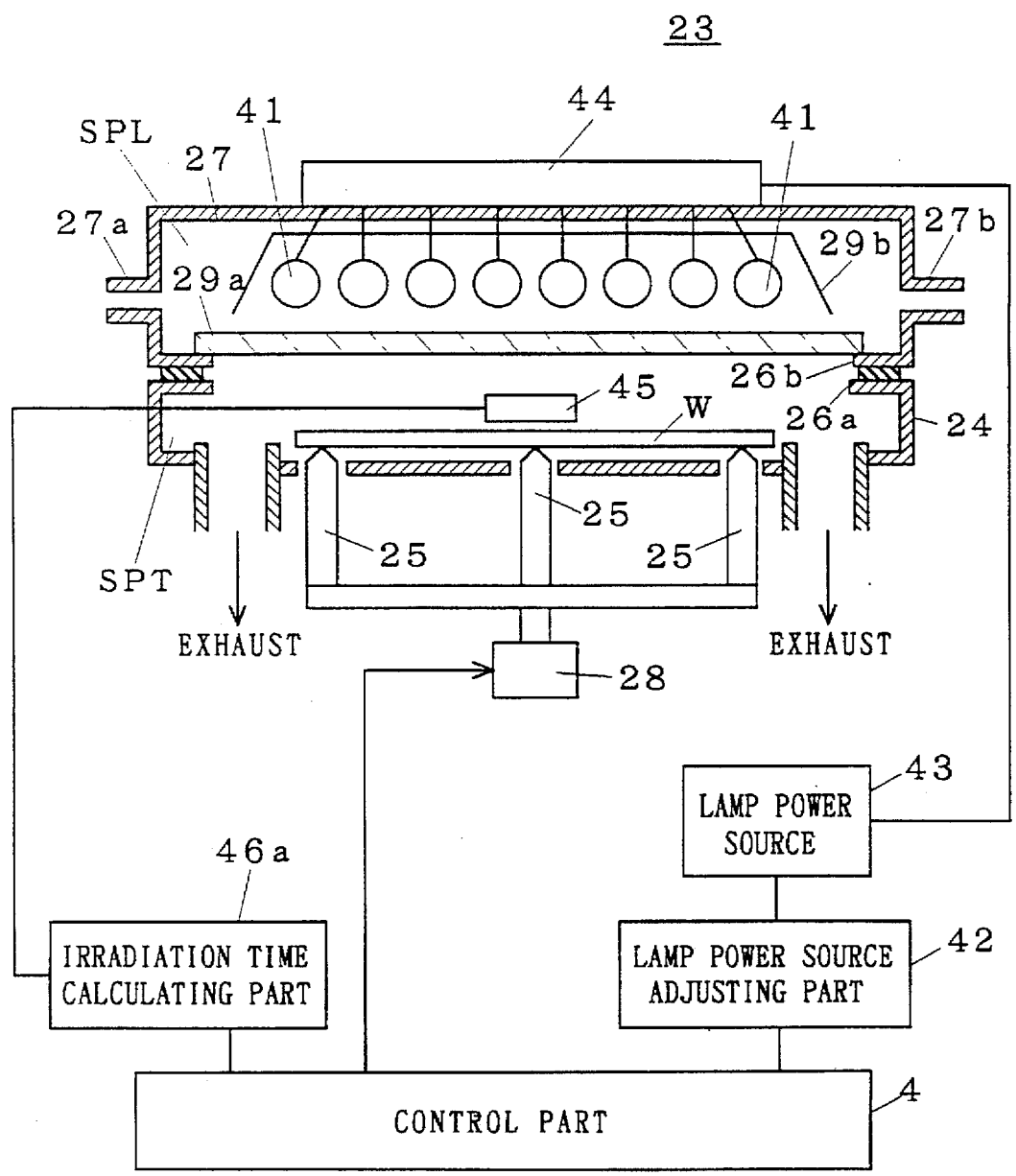
FIG. 12 is a sectional view of the ultraviolet irradiator FIG. 11.

FIG. 11 is a plan view showing a first exemplary ultraviolet irradiator 23, and FIG. 12 is a sectional view of the ultraviolet irradiator 23. This ultraviolet irradiator 23, which is provided with a plurality of upwardly projecting support pins 25 passing through a bottom surface portion of a substrate box 24, is vertically movable by an air cylinder 28, for supporting each substrate W by the support pins 25. Thus, the plurality of support pins 25 serve as support means for supporting the substrate W in this example. However, the method of supporting the substrate W is not restricted to this, but the substrate W may alternatively be supported by a vacuum suction chuck, for example.

The substrate box 24 is provided on its upper surface with an opening 26a which is larger in size than the substrate W supported by the support pins 25.

A lamp box 27 having an opening 26b which is substantially identical in size to the opening 26a on its bottom surface portion is arranged on the substrate box 24, so that the openings 26a and 26b are opposed to each other. A quartz plate 29a is arranged in the lamp box 27 to block the opening 26b, thereby defining a lamp space SPL. Further, eight dielectric barrier discharge excimer lamps 41 are aligned with each other in a position above the quartz plate 29a. Therefore, power which is transmitted from a lamp power source 43 at a timing described later is supplied to the dielectric barrier discharge excimer lamps 41 through a power source relay box 44, to turn on the lamps 41. Thus, the dielectric barrier discharge excimer lamps 41 emit ultraviolet light downward through the quartz plate 29a to be applied onto a surface of the substrate W supported by the support pins 25.

In this lamp box 27, a reflector 29b is arranged between an upper surface of the lamp box 27 and the dielectric barrier discharge excimer lamps 41, for effectively guiding the ultraviolet light from the dielectric barrier discharge excimer lamps 41 toward the substrate W. As shown in FIG. 12, an inlet port 27a for nitrogen gas is provided on a left side portion of the lamp box 27, so that nitrogen gas from a nitrogen gas supply part (not shown) can be introduced into the lamp space SPL which is defined by the lamp box 27 and the quartz plate 29a. On the other hand, an exhaust port 27b for the nitrogen gas is provided on a right side portion of the lamp box 27, so that the nitrogen gas is exhausted from the lamp space SPL by exhaust means (not shown) such as an exhaust system or an exhaust pump coupled with the exhaust port 27b. In the lamp space SPL, therefore, oxygen mainly causing absorption/damping of ultraviolet light outgoing from the dielectric barrier discharge excimer lamps 41 is eliminated while the nitrogen gas exerting no influence on damping of the ultraviolet light is filled up, whereby the ultraviolet light from the dielectric barrier discharge excimer lamps 41 can be efficiently applied to the substrate W. While the quartz plate 29a is employed for defining the lamp space SPL in this example, the means for defining the space SPL may be formed by a plate member transmitting the ultraviolet light, and is not restricted to such a quartz plate.

On the other hand, exhaust means (not shown) such as an exhaust system or an exhaust pump is connected also onto the substrate box 24, for evacuating a substrate treatment space SPT which is defined by the substrate box 24 and the quartz plate 29a. In this substrate treatment space SPT, an illuminometer 45 is arranged in a position where meter 45 will not interfere with the substrate W receiving the ultraviolet light applied through the quartz plate 29a, thereby measuring the illuminance of the ultraviolet light on the substrate W. This illuminometer 45 is electrically connected with an irradiation time calculating part 46a, so that the illuminance measured by the former is supplied to the latter.

The irradiation time calculating part 46a obtains a turn-on time of the dielectric barrier discharge excimer lamps 41 on the basis of change of the illuminance which is supplied from the illuminometer 45. Ultraviolet energy which is supplied to the substrate W is decided by a total dose obtained by multiplying the illuminance on the substrate W by the irradiation time. In this example, therefore, a time required for the ultraviolet energy, which is supplied to the substrate W for irradiating the substrate W with ultraviolet light of changing illuminance, is determined for reaching a prescribed amount.

The irradiation time calculating part 46a is electrically connected with a control part 4 for controlling the overall irradiator, so that a signal related to the radiation source turn-on time obtained in the aforementioned manner is supplied to the control part 4. The control part 4 receiving this signal controls power supply from the lamp power source 43 to the dielectric barrier discharge excimer lamps 41 through a lamp power source adjusting part 42 that serves as switching means for on/off switching of the dielectric barrier discharge excimer lamps 41, to adjust the ultraviolet energy which is supplied to the substrate W by controlling the turn-on time period of the lamps 41.

Figure 13:
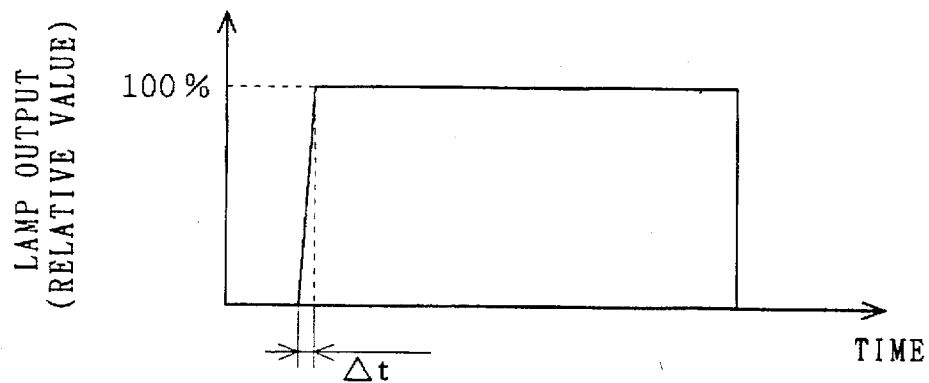
FIG. 13 is a graph showing lamp output characteristics of a dielectric barrier discharge excimer lamp.
Figure 14:
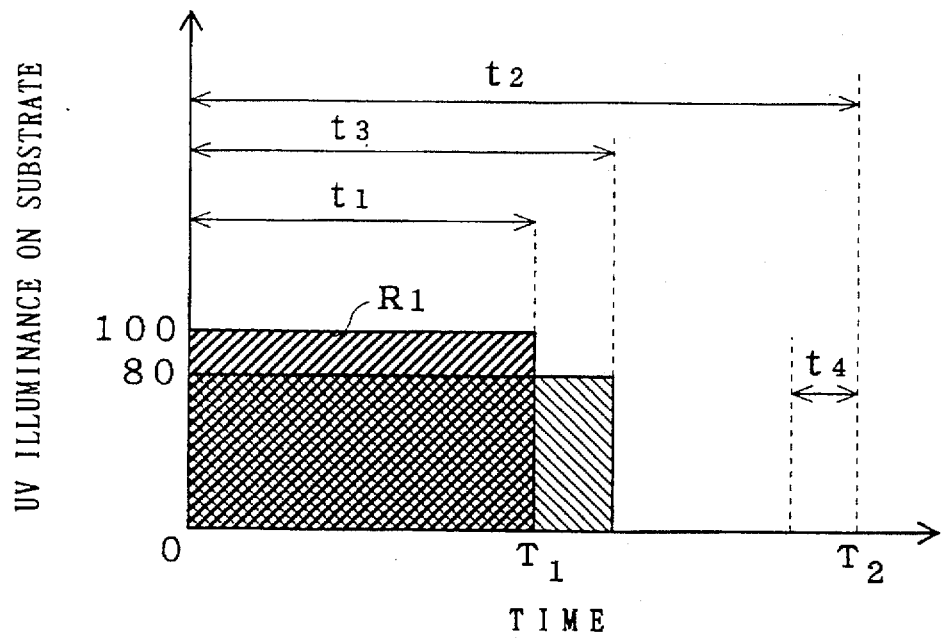
FIG. 14 is a diagram illustrating operation of the ultraviolet irradiator.

Substrate treatment steps are now described with reference to FIGS. 13 and 14. It is assumed here that t2 represents a working period. The term "working period" herein employed indicates a time required for a carrier robot for circulating through respective units in a cycle where the carrier robot circulates between a plurality of units for successively exchanging and carrying a plurality of substrates thereby treating the same, while this term indicates a time for introducing/discharging the substrates into/from each unit, with inclusion of times required for introducing/discharging the substrates into/from the unit.

First, a substrate W to be treated is introduced into the substrate treatment space SPT through a substrate inlet/outlet port 27c (FIG. 11) and placed on the support pins 25, which in turn are upwardly moved to approach the substrate W. This raises substrate W to within a prescribed distance of the dielectric barrier discharge excimer lamps 41. Then, the lamp power source 43 supplies power to the dielectric barrier discharge excimer lamps 41 in response to a processing start command from the control part 4, to start application of ultraviolet irradiation to the substrate W. In this case, outputs of the dielectric barrier discharge excimer lamps 41 (lamp output in FIG. 13) reach stable states after a lapse of a constant time $\Delta t$ from the power supply. This time $\Delta t$ is remarkably reduced as compared with that ($\Delta t$ in FIG. 18) of the conventional low-pressure mercury lamp, such that $\Delta t$ of the dielectric barrier discharge excimer lamps 41 is not more than 1 second while that of the low-pressure mercury lamp is several minutes in the case of repeating turn on and off operations of 40 and 20 seconds respectively, for example, and can be regarded as being substantially instantaneously stabilized in actual employment.

When the dielectric barrier discharge excimer lamps 41 are turned on, the surface of the substrate W is irradiated with the ultraviolet light in proper illuminance of 100, for example, so that a prescribed substrate treatment is started. The dielectric barrier discharge excimer lamps 41 are maintained in turn-on states by a constant time t1 which is shorter than the working period t2, and thereafter the power supply from the lamp power source 43 to the dielectric barrier discharge excimer lamps 41 is stopped at a time $T_1$ in response to a stop command from the control part 4, so that the dielectric barrier discharge excimer lamps 41 are turned off. Thus, the substrate W is supplied with a proper amount of ultraviolet energy (corresponding to an area "100×t1" of a shaded (slant) portion R1 in FIG. 14). After the turn-off operation, the turn-off states are maintained up to a lapse (end) of the working period t2, so that ultraviolet illuminance on the substrate W is zero up to a time $T_2$, as shown in FIG. 14. Discharge of the substrate W and introduction of a next substrate are performed during a final time portion t4 in the working period t2 shown in FIG. 14, so that the next substrate is thereafter treated during a next working period. While FIG. 14 shows the time for turning on the dielectric barrier discharge excimer lamps 41 as a time 0 and a time for discharging/introducing a substrate is during an end portion in the working period t2 and is in advance of an operation for turning the dielectric barrier discharge excimer lamps 41 on.

According to this example, as hereinabove described, the dielectric barrier discharge excimer lamps 41 are turned on during the time period t1 which is shorter than the working period t2. During period t1 the substrate W is supplied with a prescribed amount of ultraviolet energy, whereby the ultraviolet energy for the substrate W can be adjusted by turning off the dielectric barrier discharge excimer lamps 41 when the same reaches a prescribed amount (corresponding to the area "100×t1" of the slant portion R1 in FIG. 14) even if the working period is changed. Further, the dielectric barrier discharge excimer lamps 41 are employed as ultraviolet lamps, whereby the outputs thereof can be stabilized in a short time after the lamps are turned off even if the lamps are repeatedly turned on and off. Thus, it is possible to solve a problem of using low-pressure mercury lamps that require a long time for stabilizing in a turn-off state of the lamp. Such instability of low pressure mercury lamp requires an increase in the working period of the overall treatment step.

In the above example, the illuminometer 45 is provided for measuring the illuminance on the surface of the substrate W which is supported by the support pins 25, supplying the same to the irradiation time calculating part 46a, and obtaining the time required for the ultraviolet energy which is supplied to the substrate for reaching a prescribed amount. In a case of irradiating the substrate with ultraviolet light in changed illuminance on the basis of change of the illuminance as a turn-off time for the dielectric barrier discharge excimer lamps 41. When the lamp outputs of the dielectric barrier discharge excimer lamps 41 are reduced by time change resulting from long-time use, for example, the ultraviolet illuminance on the surface of the substrate W is reduced as shown in FIG. 14. If the dielectric barrier discharge excimer lamps 41 are turned on by the same time t1 as that before the change (reduction) of the illuminance, the ultraviolet energy which is supplied to the substrate W is reduced below the prescribed amount. According to this example, therefore, a turn-off time t3 (=1.25×t1) for the dielectric barrier discharge excimer lamps 41 is obtained by the irradiation time calculating part 46a in correspondence to the change illuminance (e.g., "80") for turning on the dielectric barrier discharge excimer lamps 41 by this turn-on time t3, whereby the ultraviolet energy which is supplied to the surface of the substrate W is identical to that before the change. Even if the lamp outputs are changed by time change of the dielectric barrier discharge excimer lamps 41 or the like, therefore, the lamp turn-on time is automatically corrected, whereby the substrate can be regularly supplied with a proper amount of ultraviolet energy.

<Second Example of Ultraviolet Irradiator>

Figure 15:
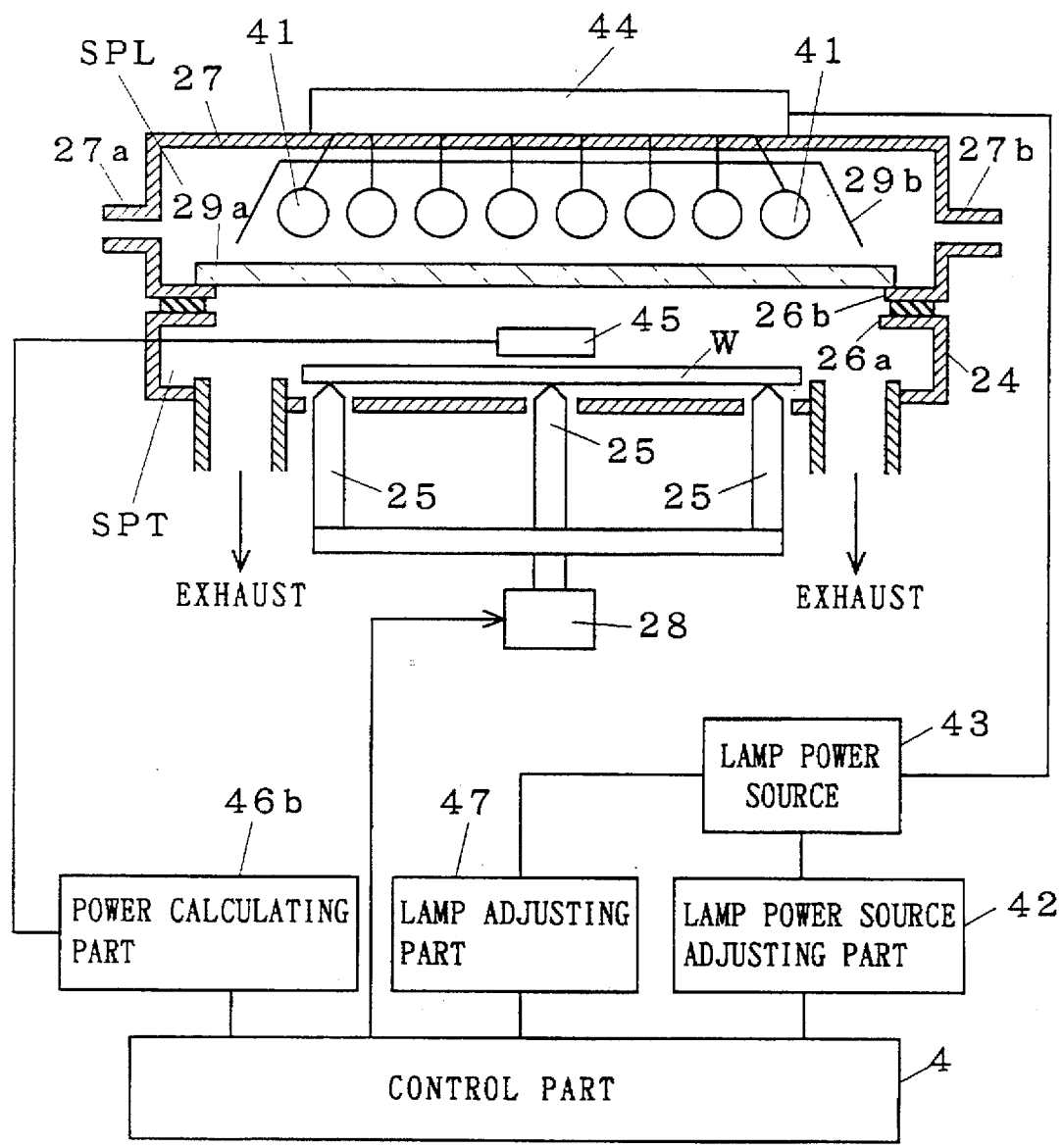
FIG. 15 is a sectional view of a second exemplary ultraviolet irradiator.

FIG. 15 is a sectional view showing a second exemplary ultraviolet irradiator 23. This ultraviolet irradiator 23 is remarkably different from the aforementioned first example (FIG. 12) in that processing contents in a power calculating part 46b are different and that a lamp adjusting part 47 is further provided for changing power which is supplied to dielectric barrier discharge excimer lamps 41 in response to a processing result in the power calculating part 46b and adjusting the lamp outputs of the dielectric barrier discharge excimer lamps 41. Other structure of this example is identical to that shown in FIG. 12.

In this example, the power calculating part 46b detects change of illuminance which is measured by an illuminometer 45. When the dielectric barrier discharge excimer lamps 41 are used for a long time, for example, the lamp outputs thereof are reduced and illuminance on a surface of a substrate W is reduced due to time change or the like, as described above. When the substrate W is irradiated with ultraviolet light for time period t1 which is identical to that before the change in this state, therefore, ultraviolet energy which is supplied to the substrate W is reduced below a prescribed amount. In this case, the dielectric barrier discharge excimer lamps 41 can be returned to original lamp outputs by properly increasing the power supplied thereto. According to this example, therefore, the amount of change of the power to be supplied to the dielectric barrier discharge excimer lamps 41 for irradiating the substrate W with the ultraviolet light in the unchanged illuminance is obtained. A signal related to the amount of change as obtained is supplied to a control part 4, and the lamp adjusting part 47 controls a lamp power source 43 on the basis of a command from the control part 4, so that the power supplied to the dielectric barrier discharge excimer lamps 41 is increased by the amount of change required. Thus, the lamp outputs from the dielectric barrier excimer lamps 41 are adjusted to maintain the illuminance on the substrate W at a constant level, thereby regularly supplying the substrate W with a proper amount of ultraviolet energy.

When the lamp outputs of the dielectric barrier discharge excimer lamps 41 are reduced, the power supplied to the lamps 41 is increased to return the same to the original lamp outputs in this example. Therefore, it is preferable to previously set the power supplied to the dielectric barrier discharge excimer lamps 41 at a low level so that the dielectric barrier discharge excimer lamps 41 provide ability which is lower than the maximum ability in an initial stage of starting of use.

While the illuminometer 45 is connected with the irradiation time calculating part 46a or the power calculating part 46b for automatically correcting the lamp outputs or the lamp turn-on time also when the lamp outputs are changed by time change of the dielectric barrier discharge excimer lamps 41 or the like so that the substrate W can be regularly supplied with a proper amount of ultraviolet energy in each of the aforementioned examples, such a structure is not indispensable if it is unnecessary or not necessary to take time slight change of the dielectric barrier discharge excimer lamps 41 or the like into consideration.

While the illuminometer 45 is adapted to directly measure the illuminance on the surface of the substrate W in each of the aforementioned first and second exemplary ultraviolet irradiators, the same may alternatively measure illuminance on another portion for indirectly calculating illuminance on the surface of the substrate W by calculation, for example.

While the substrate W is irradiated with the ultraviolet light through the eight dielectric barrier discharge excimer lamps 41 in each of the aforementioned examples, the number of the dielectric barrier discharge excimer lamps 41 may be arbitrarily selected.

<Application to Various Substrate Treatment Systems>

Figure 16:
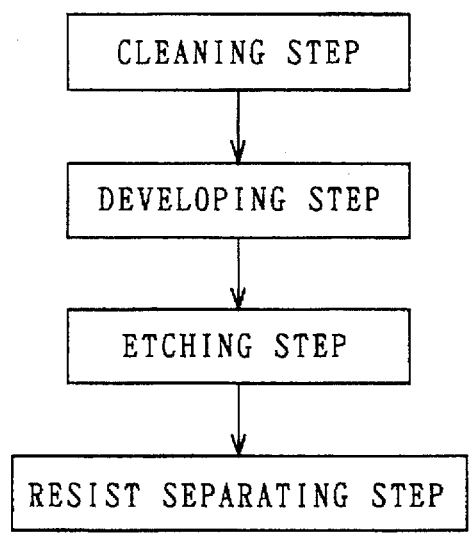
FIG. 16 is a flow chart showing steps for fabricating a glass substrate.

FIG. 16 schematically illustrates steps of fabricating a glass substrate for a liquid crystal display or the like. As shown in FIG. 16, the fabrication steps consist of a cleaning step, a developing step, an etching step, and a resist separating step. FIGS. 17 to 21 illustrate modes of substrate treatment systems utilizing ultraviolet irradiators 23 according to the present invention in these steps.

Figure 17:
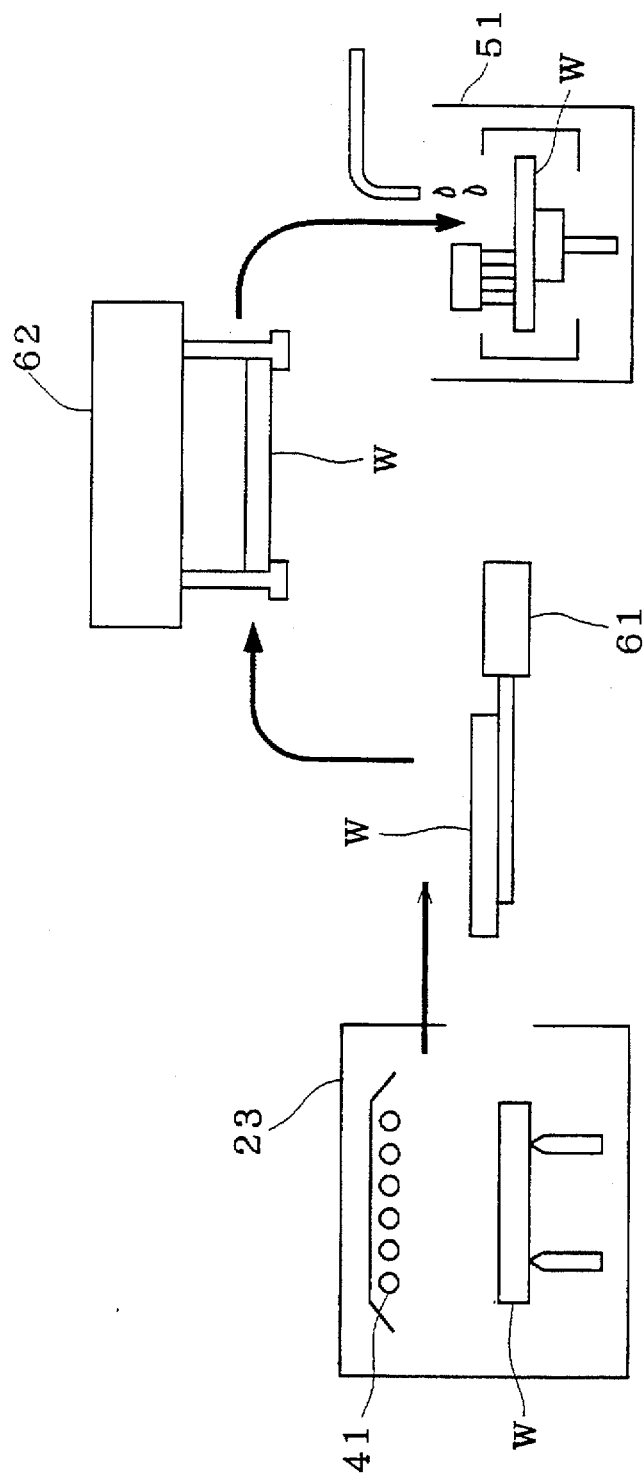
FIGS. 17 to 19 illustrate cleaning steps.
Figure 18:
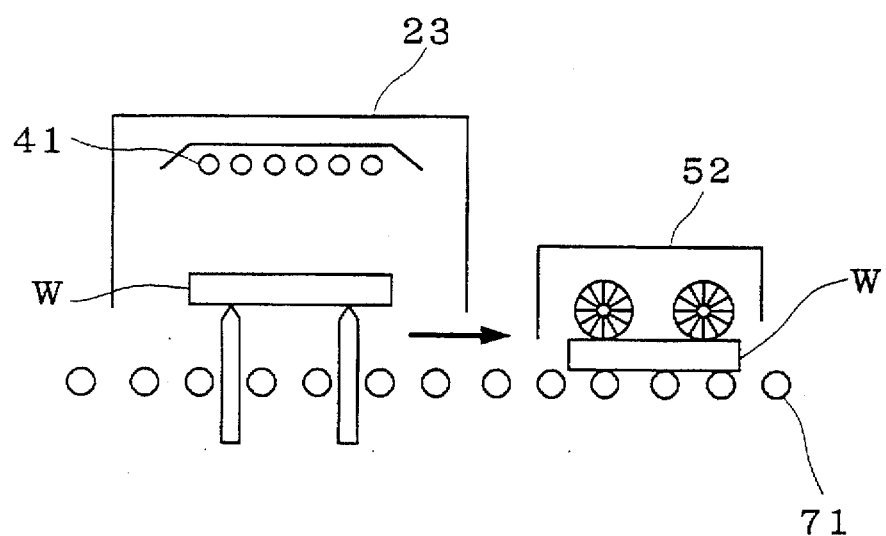

FIGS. 17 and 18 illustrate modes of utilizing the ultraviolet irradiators 23 in the cleaning step. Referring to FIG. 17, wherein a substrate is irradiated with ultraviolet light by ultraviolet irradiator utilizing dielectric barrier discharge excimer lamps 41 before performing a cleaning treatment in a spin type cleaning unit 51, whereby organic substances on the substrate surface can be decomposed through ultraviolet light and ozone generated by ultraviolet light or the substrate surface can be converted to a hydrophilic state to improve a cleaning effect in the later cleaning step. The substrate W subjected to dry cleaning is carried to the spin type cleaning unit 51 through robot hands 61 and 62, to be subjected to wet cleaning. Referring to FIG. 18, wherein, a substrate W is carried by rotation of a rollers 71, is subjected to dry cleaning in the ultraviolet irradiator 23, and thereafter subjected to wet cleaning in a roller carrier type cleaning unit 52.

It is possible to quickly switch on/off ultraviolet irradiation, irradiate the substrate with a proper amount of ultraviolet light with no influence by change in working period, implement stabilization of quality such as prevention of whitening of the substrate and change of transistor characteristics, and limit the amount of a heat ray discharged in the interior of the irradiator with the ultraviolet light by employing the ultraviolet light outgoing from dielectric barrier discharge excimer lamps in the dry cleaning in advance of the wet cleaning, whereby temperature increase in the interior of the irradiator can also be prevented. Consequently, it is possible to prevent a glass substrate from being warped, thereby avoiding a trouble in carriage or chucking. Such an effect of preventing warping can be attained particularly in no-alkali glass having a thickness of not more than 0.7 mm and a thermal expansion coefficient of over 30 to $50 \times 10^{-7}/^\circ$ C. or alkali or low alkali glass having a thickness of not more than 1.1 mm and a thermal expansion coefficient of over $50 \times 10^{-7}/^\circ$ C. Especially, the occurrence of warping can be reduced markedly and the carriage and the treatment of a substrate can be steadily attained even in a glass substrate that is thinner than the aforementioned one, a thickness of 0.3 mm for example, which is likely to be warped. The thermal expansion coefficients as mentioned above show the values in a working temperature range, which is of 0° C. to 300° C. in the present state, in the steps of photolithography or the like for producing liquid crystal displays or semiconductor devices.

Ultraviolet light of not more than 200 nm in wavelength is necessary for implementing dry cleaning employing ultraviolet light, this is attained by utilizing a dielectric barrier discharge excimer lamp of 172 mm in wavelength employing xenon, for example.

Figure 19:
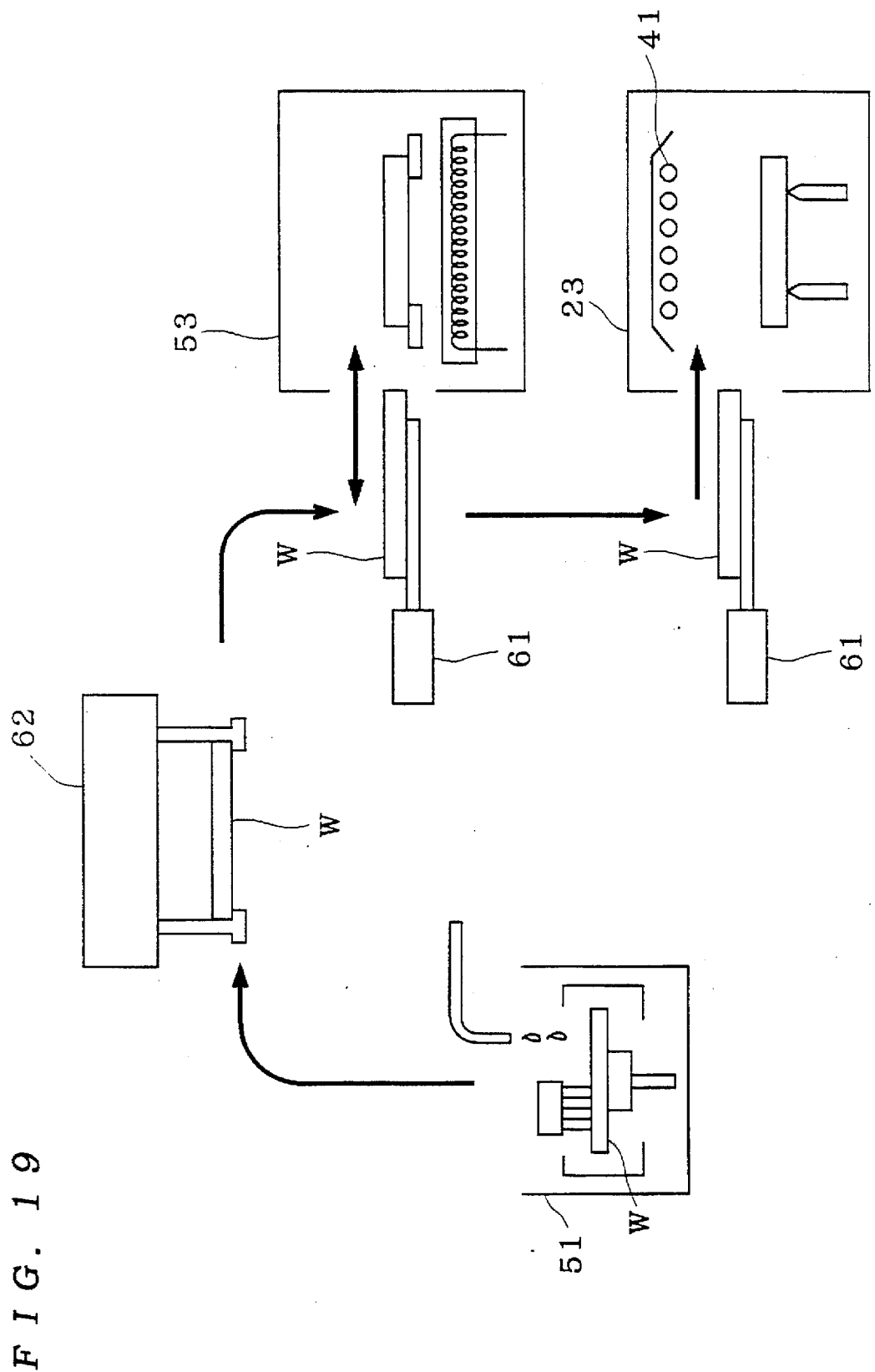

While the dry cleaning is performed before the wet cleaning in each of the above modes, dry cleaning by the ultraviolet irradiator may alternatively be performed after wet cleaning by a spin type cleaning unit or a roller carrier type cleaning unit. FIG. 19 illustrates a state of performing wet cleaning in a spin type cleaning unit 51, drying a substrate in a drying unit 53 utilizing a direct hot plate through robot hands 62 and 61, and thereafter performing dry cleaning in an ultraviolet irradiator 23 through the robot hand 61. Thus, organic substances etc. which have been impossible to wash in the wet cleaning can be removed. Further, an infrared irradiation oven can be employed as a drying unit 53 instead of a direct hot plate.

Figure 20:
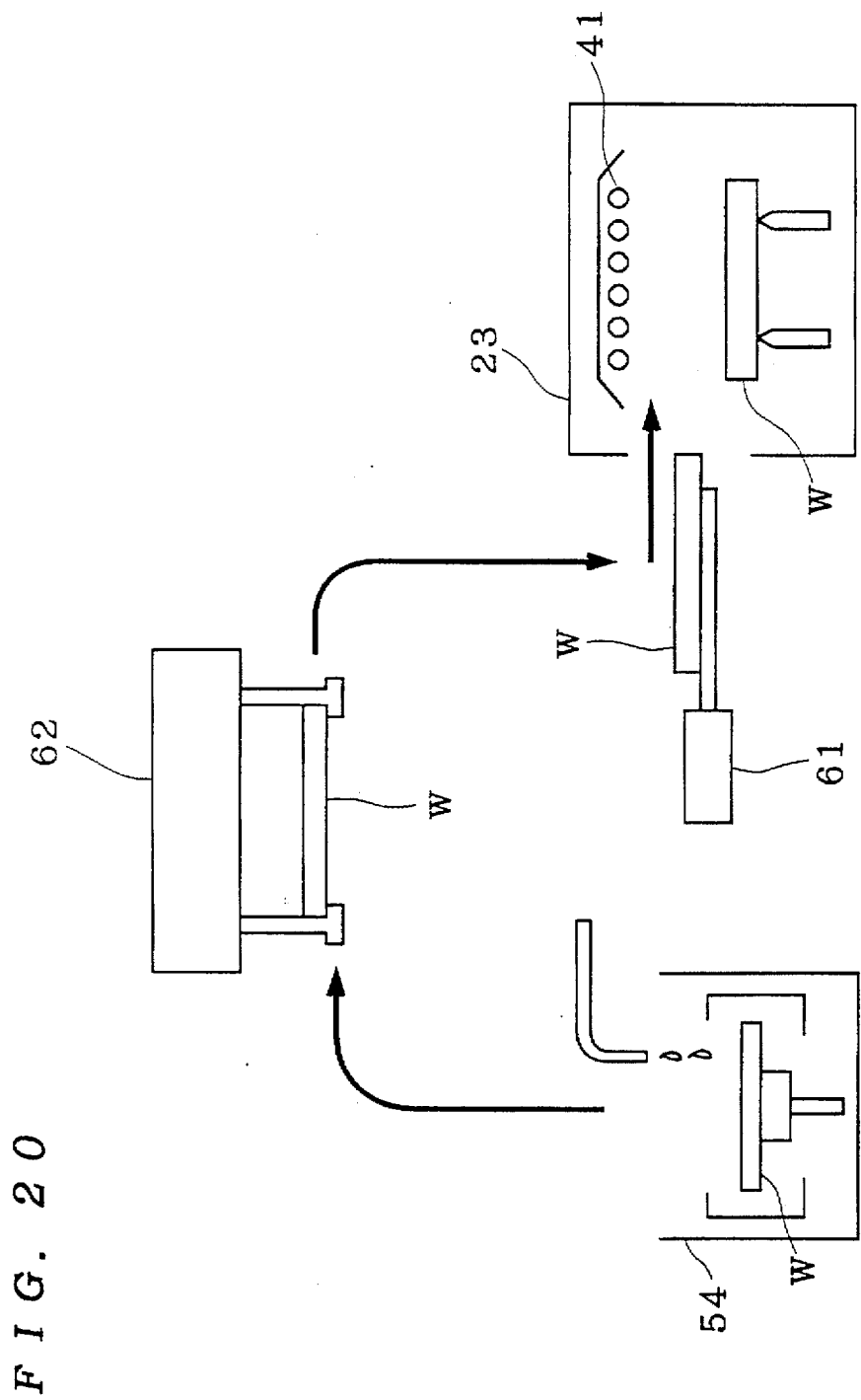
FIG. 20 illustrates a treatment solution applying step.

While the above description has been made with reference to the modes of utilizing the ultraviolet irradiators 23 in cleaning steps, the same may also be utilized in etching and resist separating steps. FIG. 20 illustrates these utilization modes. After application of a treatment solution and cleaning are performed in a treatment solution application unit 54 such as a wet etching unit or a resist separating unit, dry cleaning is performed in an ultraviolet irradiator 23 through robot hands 62 and 61. Also in this case, the object is to remove organic substances or the like, and effects such as stabilization of the quality of a substrate and prevention of warping of the substrate are attained.

Figure 21:
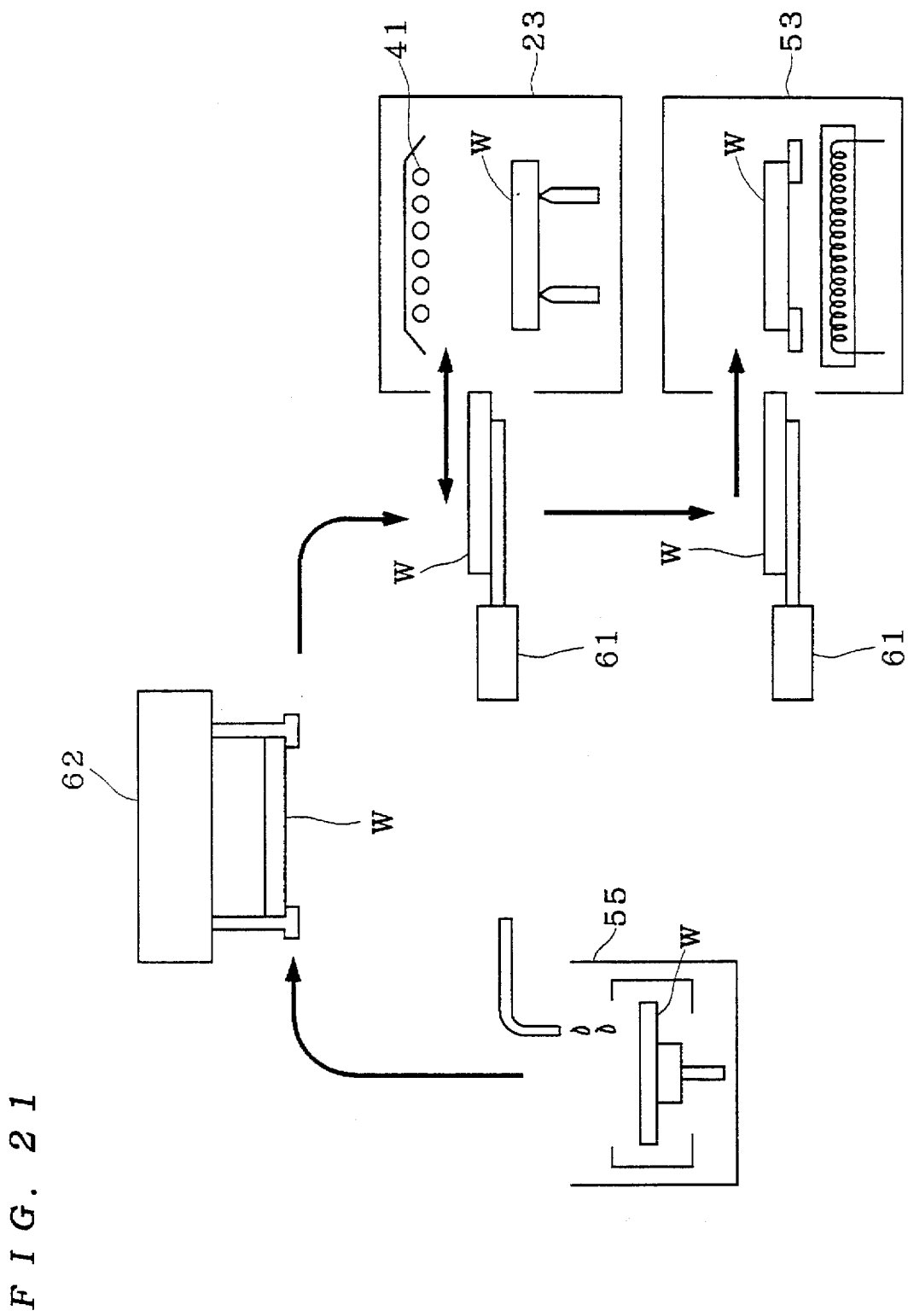
FIG. 21 illustrates a developing step.
Figure 22:
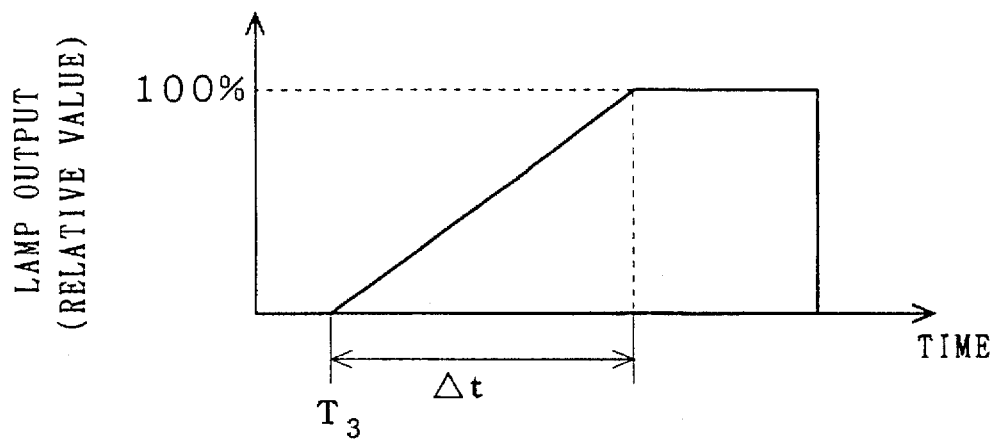
FIG. 22 is a graph showing lamp output characteristics of a low-pressure mercury lamp.
Figure 23:
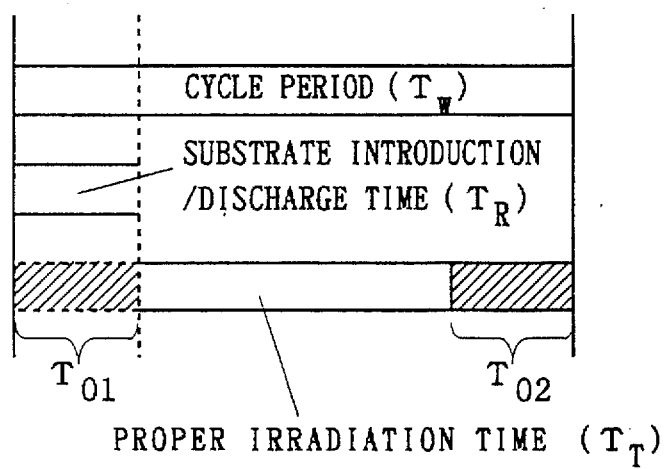
FIG. 23 is a timing chart showing the relation between proper irradiation times of the ultraviolet irradiator related to a substrate and cycle periods.

The inventive ultraviolet irradiator employing a dielectric barrier discharge excimer lamp can also be employed for hardening a resist layer, in addition to dry cleaning. FIG. 21 illustrates a utilization mode of irradiating a resist layer on a surface of a substrate W which is developed in a spin type developing unit 55 with ultraviolet light from dielectric barrier discharge excimer lamps 41 of an ultraviolet irradiator 23 through robot hands 62 and 61 for hardening the resist and thereafter performing drying in a drying unit 53 utilizing a direct hot plate through the robot hand 61.

The ultraviolet light employed in this mode has a long wavelength of at least 300 nm, and this is implemented by utilizing dielectric barrier discharge excimer lamps employing xenon-fluorine, for example. Also in this case, effects such as stabilization of the quality by optimization of the dose of the ultraviolet light and prevention of warping of the substrate by prevention of temperature rise in the interior of the irradiator can be attained, similarly to the dry cleaning.

While the ultraviolet irradiator and a unit group including various treatment units define a substrate treatment system in each of the aforementioned modes, the system may be further provided with additional treatment units.

While the invention has been shown and described in detail, the foregoing description is in all aspects illustrative and not restrictive. It is therefore understood that numerous modifications and variations can be devised without departing from the scope of the invention.

What is claimed is:

1. An ultraviolet irradiator for irradiating a substrate with ultraviolet light, comprising:
  a) a light source including a dielectric barrier discharge excimer lamp for irradiating said substrate with ultraviolet light; and
  b) control means for controlling said light source, being provided with:
    b-1) storage means for storing a plurality of values expressing respective doses of irradiation of said ultraviolet light for different substrates,
    b-2) selection means for selecting a single value from said plurality of values, and
    b-3) irradiation control means for controlling energization and deenergization of said light source itself to turn said light source on an off, respectively, said control means turning said light source off when an amount of irradiation of ultraviolet light for said substrate reaches a dose of irradiation corresponding to said single value.

2. The ultraviolet irradiator in accordance with claim 1, wherein said selection means is provided with:
  b-2-1) designation means for designating a single type from a plurality of types of treatments for said substrate, and
  b-2-2) means for selecting said single value in response to said single type.

3. The ultraviolet irradiator in accordance with claim 2, wherein a thin film is formed on a surface of said substrate,
  said ultraviolet light acts on said surface of said substrate, and
  said plurality of types of treatments for said substrate correspond to a plurality of types of said thin film, respectively.

4. The ultraviolet irradiator in accordance with claim 1, wherein said plurality of values express a plurality of irradiation periods for said substrate by said ultraviolet light, and
  said irradiation control means is provided with:
    b-3-1) means for turning on said light source by a period being responsive to said single value.

5. The ultraviolet irradiator in accordance with claim 1, wherein said plurality of values express a plurality of irradiation starting times for said substrate by said ultraviolet light, and
  said irradiation control means is provided with:
    b-3-2) means for turning on said light source at an irradiation starting time being responsive to said single value.

6. A substrate treatment system for performing a series of treatments on a substrate, comprising:

a) an ultraviolet irradiator for irradiating said substrate with ultraviolet light;

b) a treatment unit group for performing prescribed treatments on said substrate; and c) carrier means for carrying said substrate between said ultraviolet irradiator and said treatment unit group, said ultraviolet irradiator being provided with:

a-1) a light source including a dielectric barrier discharge excimer lamp for irradiating said substrate with ultraviolet light; and a-2) control means for controlling said light source, being provided with:

a-2-1) storage means for string a plurality of values expressing respective doses of irradiation of said ultraviolet light for different substrates, a-2-2) selection means for selecting a single value from said plurality of values, and a-2-3) irradiation control means for deenergizing said light source itself to turn said light source off when an amount of irradiation of ultraviolet light for said substrate reaches a dose of irradiation corresponding to said single value.

7. The substrate treatment system in accordance with claim 6, wherein said treatment unit group is provided with:

b-1) a wet cleaning unit for wet cleaning said substrate.

8. The substrate treatment system in accordance with claim 7, wherein said carrier means is provided with:

c-1) means for carrying said substrate from said ultraviolet irradiator to said wet cleaning unit.

9. The substrate treatment system in accordance with claim 7, wherein said carrier means is provided with:

c-2) means for carrying said substrate to said ultraviolet irradiator after completion of said wet cleaning.

10. The substrate treatment system in accordance with claim 6, wherein said treatment unit group is provided with:

b-2) an application unit for applying a prescribed treatment solution to said substrate, and said carrier means is provided with:

c-3) means for carrying said substrate to said ultraviolet irradiator after completion of application of said treatment solution.

11. The substrate treatment system in accordance with claim 6, wherein said treatment unit group is provided with:

b-3) a developing unit for developing a resist layer that is applied to a surface of said substrate, and b-4) a drying unit for drying said substrate, and said carrier means is provided with:

c-4) means for carrying said substrate to said ultraviolet irradiator after developing of said resist layer is complete, and c-5) means for carrying said substrate to said drying unit after completion of irradiation with said ultraviolet light in said ultraviolet irradiator.

12. The substrate treatment system in accordance with claim 6, wherein said treatment unit group is provided with:

b-5) a separating unit for separating a film formed on a surface of said substrate, and said carrier means is provided with:

c-6) means for carrying said substrate to said ultraviolet irradiator after separation of said film is completed.

13. The substrate treatment system in accordance with claim 6, wherein said treatment unit group is provided with:

b-6) an etching unit for etching a surface of said substrate, and said carrier means is provided with:

c-7) means for carrying said substrate to said ultraviolet irradiator after completion of said etching.

14. The substrate treatment system in accordance with claim 6, wherein said carrier means is provided with:

c-8) itinerancy means itinerating along said ultraviolet irradiator and said treatment group in a prescribed cycle, said irradiation control means being provided with means for activating said light source by a period shorter than said prescribed cycle, and said itinerancy means carrying said substrate out of said ultraviolet irradiator after said period of activating of said light source.

15. An ultraviolet irradiator for irradiating a substrate with ultraviolet light, comprising:

a) a dielectric barrier discharge excimer lamp emitting ultraviolet light for irradiating said substrate with the ultraviolet light; and b) control means for controlling driving of said dielectric barrier discharge excimer lamp, said control means being provided with:

b-1) a calculator for calculating a required time for ultraviolet energy supplied to said substrate to reach a prescribed dose, b-2) an activator for activating said dielectric barrier discharge excimer lamp, and b-3) a deactivator for deactivating said dielectric barrier discharge excimer lamp after said required time has elapsed.

16. The ultraviolet irradiator in accordance with claim 15, further comprising:

c) an illuminometer for measuring illuminance on a surface of said substrate, said control means being provided with:

b-1) feedback control means for controlling driving of said dielectric barrier discharge excimer lamp in response to a measured value of said illuminance, said calculator for calculating said required time being provided with;

b-1-1) a portion for calculating said required time from said illuminance, and time required for ultraviolet energy supplied to said substrate to reach a prescribed dose for cleaning.

17. The ultraviolet irradiator in accordance with claim 15, wherein said substrate is a glass substrate.

18. The ultraviolet irradiator in accordance with claim 17, wherein said glass substrate is a no-alkali glass substrate having a thickness of 0.3 to 0.7 mm and a thermal expansion coefficient of over 30 to $50 \times 10^{-7}/°$ C.

19. The ultraviolet irradiator in accordance with claim 17, wherein said glass substrate is a low alkali glass substrate or an alkali glass substrate, said glass substrate having a thickness of 0.3 to 1.1 mm and a thermal expansion coefficient of over $50 \times 10^{-7}/°$ C.

* * * * *